United States Patent [19]

Planer

[11] Patent Number: 4,504,787
[45] Date of Patent: Mar. 12, 1985

[54] ELECTRONIC WATTHOUR METER

[75] Inventor: Norman G. Planer, Annandale, Minn.

[73] Assignee: Honeywell Inc., Minneapolis, Minn.

[21] Appl. No.: 365,226

[22] Filed: Apr. 5, 1982

[51] Int. Cl.³ ............... G01R 21/06; G01R 33/00
[52] U.S. Cl. ............................. 324/142; 324/117 R
[58] Field of Search ............ 324/142, 117 H, 252, 324/117 R, 99 R, 99 D

[56] References Cited

U.S. PATENT DOCUMENTS

| | | | |
|---|---|---|---|
| 3,323,056 | 5/1967 | Haley | 324/117 |
| 3,546,579 | 12/1970 | Paul et al. | 324/46 |
| 3,716,781 | 2/1973 | Almasi et al. | 324/46 |
| 3,848,217 | 2/1975 | Lazzari | 338/32 R |
| 3,864,751 | 2/1975 | Beaulieu et al. | 360/113 |
| 3,945,038 | 3/1976 | Lazzari | 360/113 |
| 4,024,489 | 5/1977 | Bajorek et al. | 338/32 R |
| 4,048,557 | 9/1977 | Chen | 324/46 |
| 4,075,671 | 2/1978 | Cheatham et al. | 360/113 |
| 4,097,802 | 6/1978 | Mahopac | 324/252 |

FOREIGN PATENT DOCUMENTS 886455  1/1962  United Kingdom ........... 324/117 H

OTHER PUBLICATIONS

Sun, S. F., "Theory and Applications . . . "; Solid State Electronics; vol. 7; 1964; pp. 363–371.
C. H. Bajorek et al., "A Permalloy Current Sensor", IEEE (obscured), Nov. 1976, pp. 813–815.
Yu Jen Wong et al., *Function Circuits Design and Applications*, McGraw-Hill, N.Y., 1977, pp. 280–281.

*Primary Examiner*—Ernest F. Karlsen
*Attorney, Agent, or Firm*—Charles G. Mersereau

[57] ABSTRACT

An electric watthour meter for measuring AC power consumption is disclosed which includes a pair of parallel plate bus bars through which all of the power to be measured is conducted, a magnetoresistive bridge sensor disposed between the pair of bus bars such that the flow of current in either or both of said bus bars produces a corresponding voltage signal from the sensor indicative of the total amount of current flowing in the bus bars and a signal processing system for utilizing the signal from the sensor to produce an output indicative of the total AC power conducted by the bus bars.

14 Claims, 9 Drawing Figures

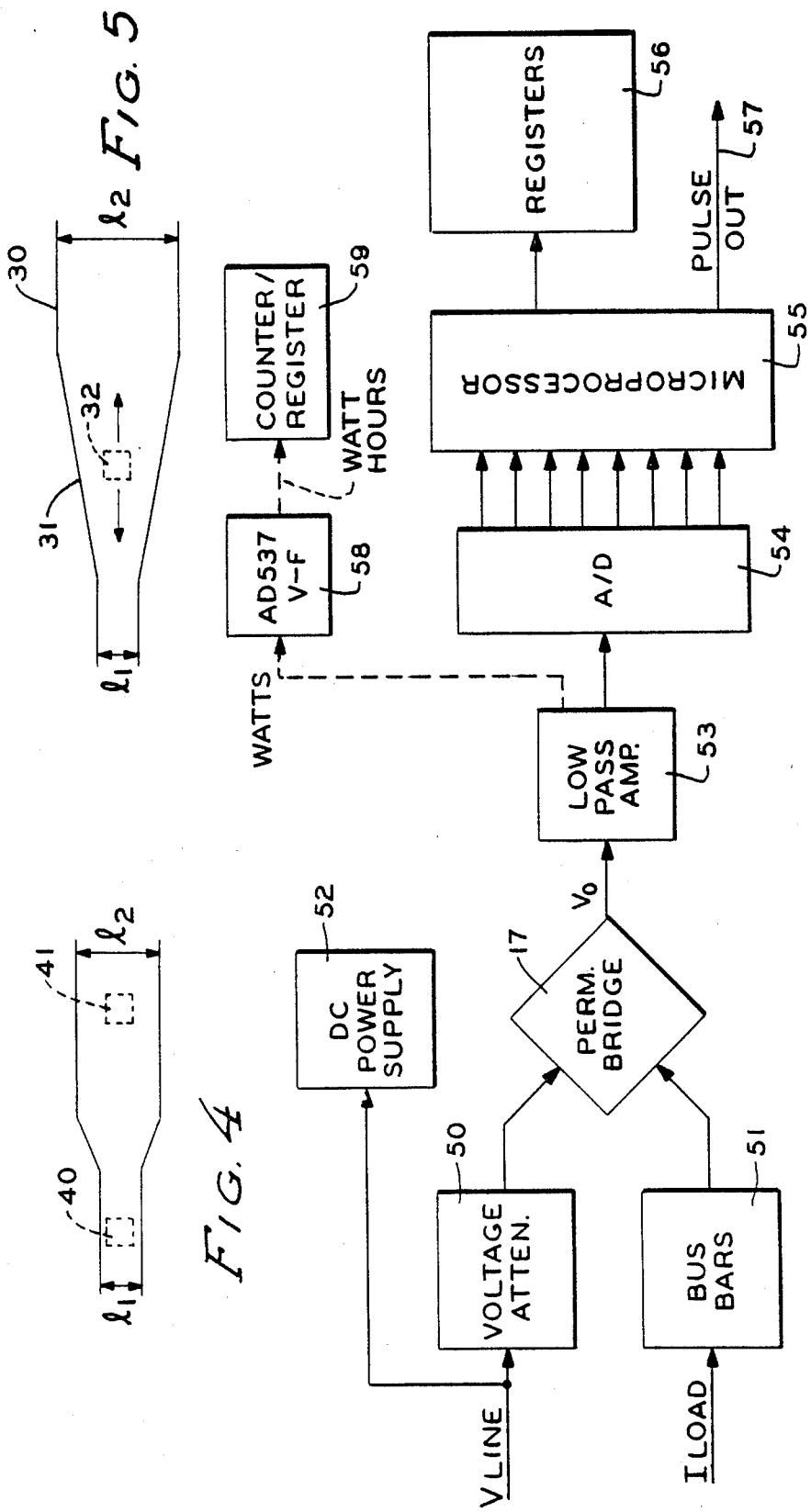

ELECTRONIC WATTHOUR METER

BACKGROUND OF THE INVENTION

1. Field of the Invention

The present invention relates to the field of electric power consumption measurement in general and, in particular, to an electronic watthour meter which employs a magnetoresistive bridge sensor utilizing a ferromagnetic material such as permalloy.

2. Description of the Prior Art

The well-known electro-mechanical induction watthour meter has been utilized for measuring electric energy usage for the purpose of computing electric energy revenues for many years. Recently, however, added flexibility has been required of metering devices such as the utilization of variable rates, remote reading communication, instantaneous power consumption readings and other functions. Such new demands for flexibility have led to the increased need for a low cost, highly accurate and reliable watthour meter which is capable of performing diverse functions.

A magnetometer consisting of an anisotropic thin ferromagnetic film arranged in a Wheatstone bridge configuration utilized to sense an AC magnetic field is known in the prior art. An example of such measurement is disclosed in U.S. Pat. No. 3,546,579, which illustrates and describes the magnetometer utilizing such a bridge configuration. It is also known in the prior art that certain alloys of iron and nickel known as permalloy may be used to create very sensitive magnetoresistive elements. While sensitive magnetoresistive bridge configurations have found many uses, these have been primarily in sensing very small electric currents. The prior art has not shown how to take advantage of the high sensitivity of such elements to provide a simple, inexpensive system for measuring electric power consumption.

SUMMARY OF THE INVENTION

By means of the present invention there is provided an inexpensive, accurate and versatile, solid state watthour meter which utilizes a magnetometer between parallel bus bars which produces a signal in the form of a voltage output corresponding to the current in the bus bars. The output signal is processed to produce an accurate measurement of the power consumption.

In the preferred embodiment a Wheatstone bridge configuration of a magnetoresistive material such as Fe-Ni alloy is disposed between parallel bus bars which are connected so as to carry all the current to be measured. A voltage source as by direct connection from the bus bars is connected across one pair of nodes of the bridge and a sensing system is connected across the other pair of nodes. The sensed field caused by current flow in the bus bars produces a proportional voltage output from the sensor which is amplified and processed to produce a resulting signal indicative of the total power consumption, instantaneous power consumption or other desired parameter.

In a second embodiment a DC source is connected across one pair of nodes of the bridge and the imbalance signal output of the other pair of nodes is suitably amplified and, in part, is fed back to a feedback coil which surrounds the sensor. The feedback coil is oriented so that it generates a field directly opposing the field generated by the load currents. The gain of the amplifier is large enough so that the field will cancel the field produced by the load currents and return the bridge back to the balance condition. The required balancing feedback is then proportional to the sum of the load currents and can be multiplied by the sensed line voltage to give instantaneous power. The accumulated instantaneous power signal is then utilized to realize an output of total power consumption or other desired result.

BRIEF DESCRIPTION OF THE DRAWING

In the drawings wherein like numerals are utilized to designate like parts throughout the same:

FIGS. 4 and 5 show alternate bus bars configurations in accordance with the embodiment of FIG. 1;

FIG. 6 is a schematic block diagram of a watthour meter using the sensing system of the embodiment of FIGS. 1-3;

DESCRIPTION OF THE PREFERRED EMBODIMENT

Figure 1:
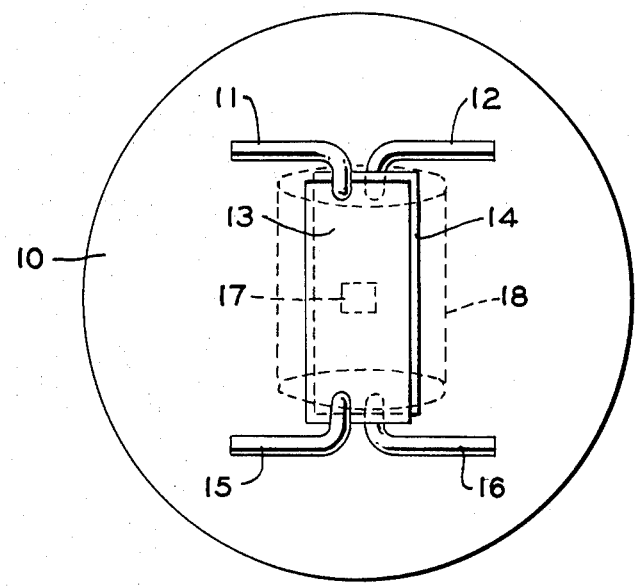
FIG. 1 is a plan view of the bare connections of a watthour meter in accordance with one embodiment of the invention.

In FIG. 1 there is shown a watthour meter base 10 having powerline voltage input conductors 11 and 12 connected respectively to parallel bus bars 13 and 14 which, in turn, are connected to respective output conductors 15 and 16. A current sensing element is indicated between the bus bars at 17 and an external magnetic field shield in the form of an open-ended cylinder surrounding the bus bar configuration is represented by the dashed line 18.

Figure 2:
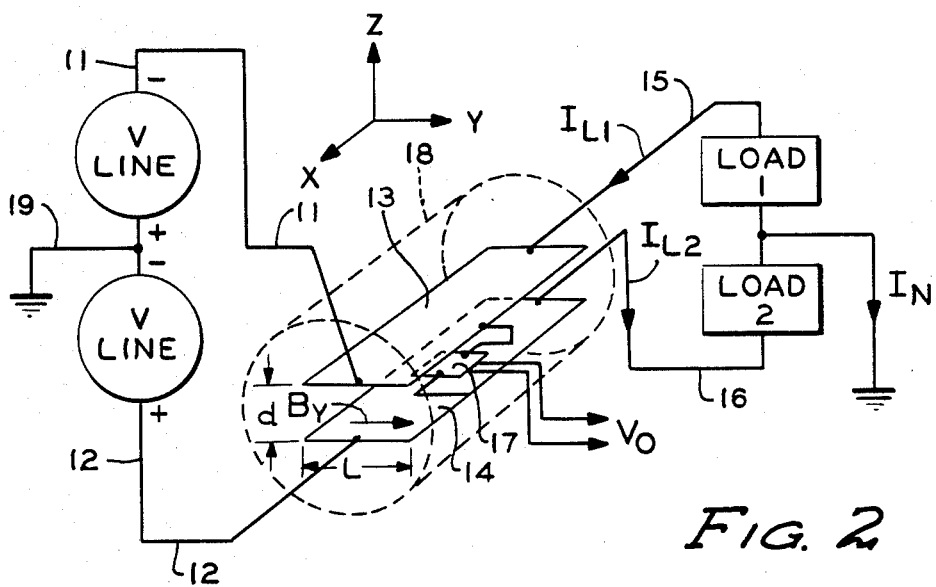
FIG. 2 is a perspective schematic view of the sensing system of a watthour meter in accordance with FIG. 1.
Figure 3:
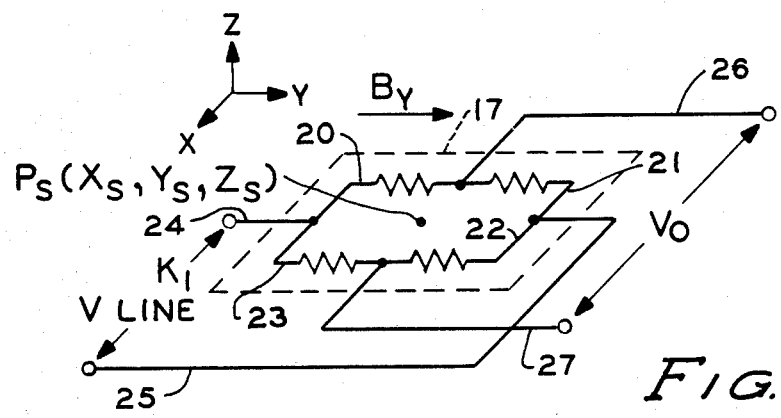
FIG. 3 is an enlarged view of the sensor of FIG. 2.

FIGS. 2 and 3 depict further details of the shielded parallel bus bar embodiment of FIG. 1. FIG. 2 depicts a typical hook-up for a single phase 3-wire system including neutral conductor 19 which is typical of 240 volt residential electrical service. Representative loads are also depicted. The substantially flat, parallel bus bars 13 and 14 are depicted as having a width, l, and are separated by a distance, d, and the field of interest is represented by $B_y$.

FIG. 3 depicts the magnetoresistive Wheatstone bridge configuration associated with the power sensing system of the invention in greater detail. This includes four anisotropic thin film magnetic current conductors 20, 21, 22 and 23 with associated input via conductors 24 and 25 and output via conductors 26 and 27. The highly sensitive magnetoresistive Wheatstone bridge may comprise a permalloy composition such as one having approximately 80% nickel and 20% iron. This may be in the form of thin wires or as a film deposited on a suitable substrate material in a well-known manner. Conductors 24 and 25 are connected to a source of line voltage which may be obtained directly from the bus bars 13 and 14.

The magnetoresistive permalloy Wheatstone bridge is placed between the bus bars and within the shield 18 such that the network substantially self-cancels the ambient field, i.e., the constant hard axis field components thereby permitting an accurate measurement of the easy axis magnetic field caused by the flow of current in either of the bus bars 13 or 14. The four elements 20, 21, 22 and 23 preferably have single-domain properties and the characteristic of uniaxial anisotropy within an anistropic field providing in the planes of said element a hard axis in the x direction designated in FIG. 3 and an orthogonal easy axis of magnetization y along which the field $B_y$ is measured.

It is known, that the parallel bus bars 13 and 14 shown in FIG. 1 approximate infinite current sheets as long as the width of each bus bar, l, is greater than 10 times the bus bar separation distance, d, or l > 10d. The magnetic flux density is the region between the bars may then be given as:

$$\vec{B} = B_y a_y \text{ where}$$

$$B_y = \frac{0.2\pi (I_{L1} + I_{L2})}{l} \text{ gauss}$$

Where $a_y$ is a unit vector in the y direction, $I_{L1}$ and $I_{L2}$ are the current traversing bus bars 13 and 14 and are given in amperes and l is in centimeters. In the region between the bus bars, except for a small fraction thereof near the edges, $B_y$ is both position independent and independent of the plate separation, d, as long as l > 10d. If, for example, the currents $I_{L1}$ and $I_{L2}$ can range from 0.3 amperes to 200 amperes which is typical for a single family dwelling, then the field, $B_y$, will range as follows:

$$\frac{0.2\pi (0.6)}{l} \leq B_y \leq \frac{0.2\pi (400)}{l} \text{ (gauss)}$$

and if $l = 6$ cm.

$$0.063 \text{ gauss} \leq B_y \leq 42 \text{ gauss}$$

This range of flux density falls within the linear range of a permalloy bridge sensor which is has been tested.

The permalloy magnetoresistive bridge sensor is placed between the bus bars so that the field, $B_y$, is incident upon it in the proper orientation as described above and shown in FIGS. 2 and 3 and the bridge is biased with a voltage proportional to the AC line voltage as shown. In this manner the bridge output, $V_o$, is caused to be proportional to the instantaneous power to loads 1 and 2 (FIG. 2.) This may be demonstrated by the following:

$$V_o \propto V_{LINE} \times (I_{L1} + L_{L2}) =$$

$$\sqrt{2} \ V_{LINE} \cos(\omega t)[\sqrt{2} \ I_{L1}\cos(\omega t + \theta_1) +$$

$$\sqrt{2} \ I_{L2}\cos(\omega t + \theta_2)] =$$

$$V_{LINE}(I_{L1}\cos\theta_1 \ _{L2}\cos\theta_2) +$$

$$V_{LINE} [I_{L1}\cos(2\omega t + \theta_1) + I_{L2}\cos(2\omega t + \theta_2)]$$

If the AC component be filtered out;

$$V_o(DC) \propto P_{ave} = V_{LINE}(I_{L1}\cos\theta_1 + I_{L2}\cos\theta_2)$$

In the above analysis $V_{LINE}$, $I_{L1}$ and $I_{L2}$ are RMS amplitudes and COS $\theta_1$ and COS $\theta_2$ the power factors of loads 1 and 2, respectively.

Calibration of the meter to compensate for variations among sensors can be easily achieved by slightly tapering the bus bars along their length. This is illustrated in FIG. 5 which includes a bus bar 30 which is tapered at 31 from a width, $l_2$, to a width, $l_1$, to compensate for a ±10% tolerance in the gain of the sensor 32, the bars can be tapered from $l_1 = 5.4$ cm to $l_2 = 6.6$ cm for a nominal width of 6 cm. Then the field sensitivity to current seen by the sensor could be varied over the range:

$$.095 \text{ gauss/ampere} \leq \frac{B_y}{I_{L1} + I_{L2}} \leq 0.115 \text{ gauss/ampere}$$

by adjusting the position of the sensor assembly 32 along the tapered section of the bus bars.

As shown in FIG. 4, for extended or dual range operation, two similar sensors 40 and 41 can be placed between bus bar sections of different widths. The outputs of the two sensors can be multiplexed electronically according to the appropriate logic. For example: if $L_1 = 3$ cm and $L_2 = 15$ cm, in accordance with the above calculations, sensor 4 would see 16.8 gauss at $I_{L1} + I_{L2} = 400$ amperes and sensor 40 would see 16.8 gauss at $I_{L1} + I_{L2} = 80$ amperes. Sensor 41 would be caused to be active over the range of 80 to 400 amperes. (3.35 to 16.8 gauss) and Sensor 40 would be caused to be active over the range of 0.6 to 80 amperes (0.126 to 16.8 gauss).

The shield 18, shown in FIG. 2, is employed to shield the sensor 17 from external AC field components in the y direction. It must be provided because a conductor in the vicinity of this sensor which is parallel to the bus bars, ie., the length of the bus bars, generates a field which may interfere with the measurement of the sensor 17. In accordance with the embodiment described above, it has been found that for the 6 cm bus bar, a three inch diameter open ended cylindrical shield is sufficient to prevent interference under almost all expected circumstances for a normal watthour meter. Thus, a cylinder of two layers of a conventional magnetic shielding material such as 4 mil co-nectic (Trademark of Magnetic Shield Division of Perfection Mica Company of Bensonville, Ill.) material has been successfully used. That material has a saturation flux density of 7500 gauss.

The schematic block diagram of FIG. 6 illustrates a typical power sensing system in accordance with the embodiment of FIGS. 1-5. Attenuated voltage obtained directly from the power lines is supplied to two nodes of the permalloy bridge 17 as shown at 50 and the magnetic flux sensed by the sensor 17 from current traversing the bus bars is shown at block 51. DC power utilized to run other components of the system, which may be obtained in conventional fashion from the AC line input, is represented in block 52. The voltage output of the bridge 17, $V_0$, previously shown to be proportional to the instantaneous power, is amplified in conventional fashion at 53 to bring the output up to a convenient level (for example, 10 volts full scale) and filtered to suppress all but the DC component in a well-known manner. The DC component remaining has a known relationship to the average power being delivered to the metered load or loads.

As illustrated in FIG. 6, the filtered output of the amplifier 53 may be processed in one or both of two different ways. The amplified, filtered signal may be applied to an analog to digital converter 54 which, in turn, provides a digitized input representative of the instantaneous DC voltage level of the output of the amplifier 53. This is applied as an input to microprocessor 55 which can utilize the input to provide any desired output related to power consumption. Thus, it may be applied to a register 56 which can display total usage, instantaneous usage level, cost, etc. The pulse output 57 represents an alternative which can be utilized for remote reading or a remote display.

The DC voltage component may also be applied to the input of a voltage to frequency converter as at 58. The voltage to frequency converter integrates the DC signal and produces an output which consists of a train of pulses, each representing a fixed quantity of power consumed. Thus, the number of pulses per unit time is proportional to the DC input voltage. The pulses out of the converter are then counted and the count is accumulated in the counter register 59 which can also contain an easily externally readably display showing the accumulated watthour consumption as is the case with the conventional watthour meter.

Figure 8:
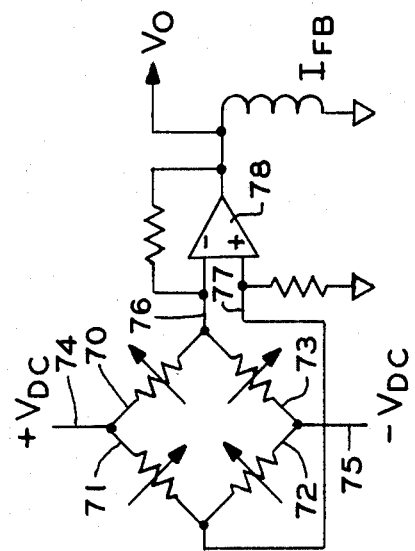
FIG. 8 is an enlarged view of the sensor of the embodiment of FIG. 7.
Figure 7:
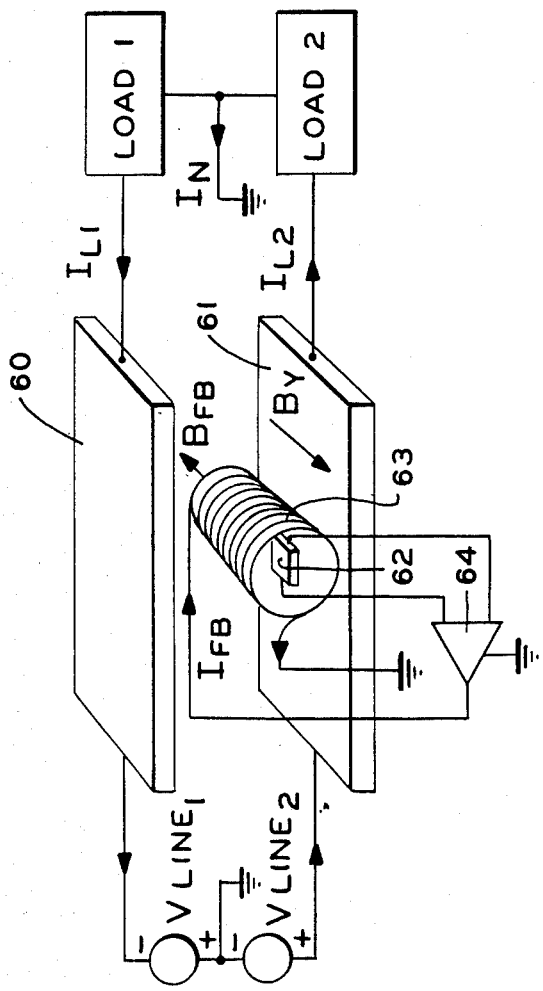
FIG. 7 is a perspective view of an alternate embodiment of the invention.

FIGS. 7 and 8 depict an alternate embodiment of the solid state watthour meter of the invention. It includes spaced parallel bus bars 60 and 61 connected to inputs and representative loads as illustrated. A magnetoresistive sensing element of the type discussed in regard to the previous embodiment is shown at 62 and illustrated in more detail in FIG. 8. The sensor is surrounded by a feedback winding 63 which is supplied with current from the output of the sensor 62 through circuitry feedback amplifier 64.

As shown in FIG. 8, the magnetoresistive bridge sensor comprises four elements 70, 71, 72 and 73. In this embodiment DC input biasing voltage is supplied to two nodes of the bridge at 74 and 75 and the sensor output is carried by conductor 76 and 77 connected to the other two nodes. The signal is amplified by a precision differential amplifier 78 prior to being fed to both the feedback amplifier 64 and to the signal processing system discussed below.

As discussed with regard to the first embodiment, the currents $I_{L1}$ and $I_{L2}$ produce a magnetic field, $B_y$, between the parallel bus bars proportional to the sum of $I_{L1}$ and $I_{L2}$;

$$B_y = \frac{0.2\pi(I_{L1} + I_{L2})}{l}$$

The field changes the resistance of the sensor element which produces a sensor voltage output proportional to the total of the load currents. This voltage is amplified at 78 and 64 and fed back in a negative sense to the feedback coil or solenoid 63 which surrounds the sensor. The feedback coil is oriented so that it generates a field, $B_{FB}$, directly opposing the field generated by the load currents, $B_y$. The gain of the amplifier 64 is made large enough, so that the field generated by the solenoids cancels the field produced by the load currents, driving the permalloy bridge back to the balanced condition. Of course, the voltage at the output of the amplifier 78, $V_{01}$ is proportional to the sum of $I_{L1}$ and $I_{L2}$. As discussed below with regard to FIG. 9, this voltage is multiplied by the sensed line voltage to give the instantaneous power product.

A major advantage of this embodiment is that a small air core solenoid driven with reasonable current and voltage can supply the cancelling magnetic field required for a high total load current ($I_{L1}$ plus $I_{L1}$) of, for example, 400 amperes. For example, a 1000 turn coil of No. 34 copper wire wound in 16 alternating layers of 62 and 63 turns has been found to require only 33 mA (RMS) at approximately 6.5 V (RMS) to null a sensor for a 400 ampere load current through 6 cm wide bus bars. The coil had a DC resistance of about 183Ω and an inductance of about 40 mH. At 60 HZ, the total impedance was 198Ω producing a 6.5 volt drop at 33 mA. This can be contrasted with other feedback methods using a conventional magnetic flux concentrator which would require 400 mA of feedback current for a 1000 turn feedback coil and at least double the 6.5 volts required for cancelling the load current field.

Thus, this embodiment of the invention provides a way to eliminate the dependence on the characteristics of the permalloy or other magnetoresistive bridge except at the null point but without requiring an unrealistic feedback drive for high load currents encountered in an electric watthour meter. The feedback arrangement restricts the operation of the permalloy or other magnetoresistive sensor to a very narrow range where the response is quite linear.

Figure 9:
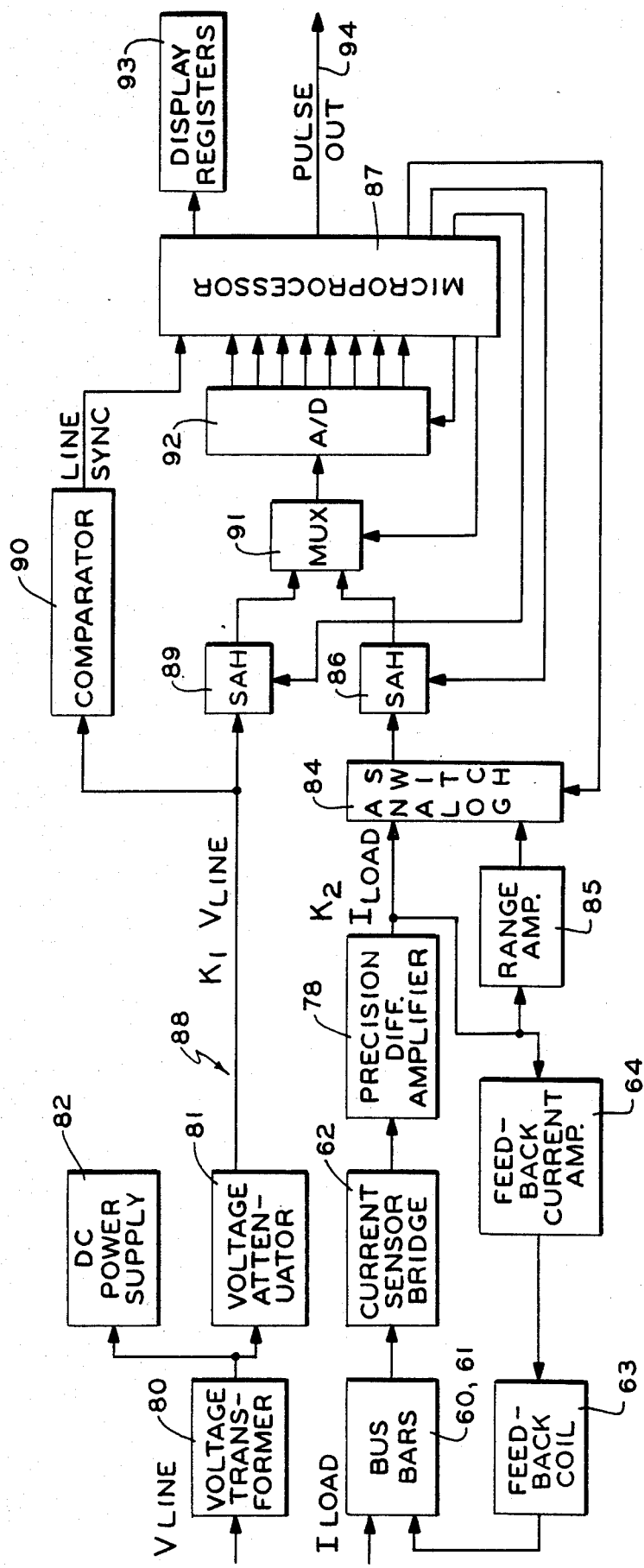
FIG. 9 is a schematic block diagram of the watthour meter using the sensing system of the embodiment of FIG. 7.

In FIG. 9 there is shown a schematic block diagram of a watthour meter utilizing the sensing system of the embodiment of FIGS. 7 and 8. A step-down transformer 80 reduces the line voltage which is then applied to a voltage attenuator 81 and is also used to supply the DC required for the current sensor bridge 62 and any other required DC in a well-known manner. The signal derived from the total load current traversing the bus bars 61 and 62 encounters the current sensor bridge 62 and precision differential amplifier 78. The feedback system for cancelling the load current field is shown including feedback current amplifier 64 and feedback coil 63.

The voltage output of the precision differential amplifier, which is proportional to the total instantaneous load current, is applied directly to an analog switch 84 and a range amplifier 85 in addition to the feedback circuit. The output of the precision differential amplifier 78 is normally applied directly through the analog switch to a sample and hold device 86. If, however, the system senses that the signal output of the precision differential amplifier is lower than a predetermined level, a signal from the microprocessor 87 is transmitted causing the output from the range amplifier which increases the signal to be applied to the sample and hold device 86.

The signal on line 88, which is proportional to the line voltage, is applied to a sample and hold device 89 and through a comparator 90 to the microprocessor 87. Also included are a multiplier 91, analog to digital converter 92, display register 93 and alternate output at 94.

The outputs of the two sample and hold devices are transmitted alternately in continuous fashion by the multiplexor 91 to the A/D converter 92. This is controlled by the microprocessor such that transmission occurs at the same point relative to the zero crossing of the line voltage signal as determined by the output of comparator 90. The voltage and current values are multiplied and integrated by the microprocessor in a well-known manner to produce the desired outputs at 93 and/or 94. These outputs may be similar to those discussed in regard to the first embodiment.

From the above it can readily be appreciated that the present invention provides a solid state watthour meter that is simple, accurate and quite versatile. It takes advantage of the accuracy of a magnetoresistive sensor in direct measurement in parallel bus bars.

The embodiments of the invention in which an exclusive property or right is claimed are defined as follows:

1. An electric watthour meter for measuring AC power consumption comprising:
   a pair of spaced parallel plate bus bar means for conducting the power to be measured;
   magnetoresistive bridge sensor means disposed between said pair of bus bar means such that any flow of currents in said bus bar means produces a corresponding signal from said sensor indicative of the total amount of current flowing in said bus bar means;
   a source of DC connected across two nodes of said magnetoresistive bridge sensor means;
   coil means disposed surrounding said sensor means;
   feedback circuit means for utilizing an output signal from said bridge sensor means to produce a field in said coil means opposing that of the current in said bus bars thereby balancing said sensor means;
   signal processing means for combining the output of said sensor means having a known relation to the current in said bus bar means and a signal indicative of the voltage in said bus bar means to produce an output result indicative of the total power traversing the meter.

2. The watthour meter according to claim 1 wherein said feedback circuit means further comprises high gain amplification means for enabling said coil means to balance signals produced by relatively high current loads in said bus bar means.

3. The watthour meter according to claim 1 wherein said DC power supply is derived from the AC line input voltage to said watthour meter.

4. The watthour meter of any of claims 1–3 wherein said signal processing means further comprises:
   means for alternately sampling said signals indicative of said current in said bus bars and said voltage in said bus bars;
   analog to digital conversion means for digitizing said sampled signals;
   synchronization means for synchronizing said sampling times with the sinusoidal pattern of said line voltage;
   microprocessor means for controlling said sampling and said synchronization means and for producing an output representing the power consumed through said bus bar means; and
   display means for displaying the output of said microprocessor means.

5. The watthour meter according to claim 4 including means for changing the range of said signal representing said current in said bus bars to provide a greater range of power measurement in the meter.

6. The watthour meter according to any of claims 2–1 wherein each said bridge sensor means comprises a Fe-Ni alloy.

7. An electric watthour meter for measuring AC power consumption comprising:
   a pair of connection means for connecting to a corresponding pair of line voltage conductors for carrying the electrical power to be measured;
   a pair of spaced parallel plate bus bar means connected in series with said line voltage conductors by means of said connection means, said bus bars being configured and disposed so as to approximate infinite current sheets;
   magnetoresistive bridge sensor means disposed between said pair of bus bars means;
   a source of biasing voltage connected to two nodes of said bridge sensor;
   said bridge sensor means being disposed such that the flow of current in either or both of said bus bar means produces a corresponding voltage output signal from said bridge sensor means indicative of the total amount of power flowing in both said bus bar means;
   signal processing means connected to the output of said bridge sensor means for utilizing the output signal from said bridge sensor means to produce a power consumption output indicative of the total AC power conducted by said bus bar means; and
   output utilization means connected to said signal processing means for utilizing said power consumption output.

8. The watthour meter according to claim 7 wherein the source of said biasing voltage is said bus bars and wherein said signal processing means further comprises means for removing the AC component from said output signal from said bridge sensor means.

9. The watthour meter according to claim 7 further comprising shield means for shielding said sensor from external electromagnetic fields which may interfere with the accurate operation of said sensor.

10. The watthour meter of any of claims 7–9 wherein both of said pair of bus bars means have symetrically matching tapered sections over part of their length and wherein the location of said bridge sensor means may be adjusted along said tapered section to calibrate said watthour meter.

11. The watthour meter according to any of claims 7–9 wherein both of said pair of bus bar means have symetrically matching segments of a plurality of different widths and wherein each said width is provided with a separate bridge sensor means so that the watthour meter will accommodate a plurality of ranges of power consumption.

12. The watthour meter according to any of claims 7–9 wherein each said bridge sensor means comprises a Fe-Ni alloy.

13. The watthour meter according to either of claims 7 or 8 wherein said signal processing means further comprises:
   amplifier means connected, to the output of said bridge sensor means for amplifying said output signal from said bridge sensor means and producing an amplifier output signal indicative thereof;
   analog to digital conversion means connected to said amplifier output for digitizing said amplifier output signal and producing a digitized output thereof;
   microprocessor means having an input connected to said analog to digital conversion means for receiving the digitized output therefrom and producing a microprocessor output indicative of power transmitted through the meter based on the digitized inputs; and
   display means for displaying data relative to the power consumption measured by the watthour meter.

14. The watthour meter of any of claims 7–9 further comprising:
   amplification means connected to the output of said bridge sensor means for amplifying said bridge sensor output signal and producing an amplified output signal indicative thereof;
   voltage to frequency conversion means connected to receive the output of said amplification means for producing pulses having a frequency indicative of the power consumption in said system; and
   register means for registering the total power consumption measured by the watthour meter.

* * * * *